(12) United States Patent
Wang

(10) Patent No.: US 8,487,707 B2
(45) Date of Patent: Jul. 16, 2013

(54) FREQUENCY SYNTHESIZER

(75) Inventor: Fucheng Wang, San Jose, CA (US)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 63 days.

(21) Appl. No.: 13/174,727

(22) Filed: Jun. 30, 2011

(65) Prior Publication Data
US 2011/0260763 A1 Oct. 27, 2011

Related U.S. Application Data

(63) Continuation-in-part of application No. 11/781,961, filed on Jul. 24, 2007, now abandoned.

(60) Provisional application No. 60/821,821, filed on Aug. 8, 2006.

(51) Int. Cl.
*H03L 7/00* (2006.01)

(52) U.S. Cl.
USPC ............ 331/16; 331/1 A; 331/1 R; 331/18; 331/25; 331/34; 327/150; 327/159; 327/162; 375/376

(58) Field of Classification Search
USPC .......... 331/1 A, 1 R, 16, 18, 25, 34; 327/150, 327/159, 162; 375/376
See application file for complete search history.

(56) References Cited

U.S. PATENT DOCUMENTS

| | | | |
|---|---|---|---|
| 4,942,370 A | 7/1990 | Shigemori | |
| 5,436,598 A | 7/1995 | Harris | |
| 5,731,741 A | 3/1998 | Yamamoto | |
| 5,942,949 A | 8/1999 | Wilson | |
| 6,639,933 B2 | 10/2003 | Yamawaki | |
| 6,667,663 B2 | 12/2003 | Ozawa | |
| 6,727,736 B1 | 4/2004 | Tsang | |
| 7,161,435 B2 | 1/2007 | Konno | |
| 2002/0075080 A1 | 6/2002 | Nelson | |
| 2002/0180540 A1 | 12/2002 | Hirai | |

(Continued)

FOREIGN PATENT DOCUMENTS

| | | |
|---|---|---|
| CN | 1117239 A | 2/1996 |
| CN | 1278675 A | 1/2001 |
| CN | 1065393 C | 5/2001 |

OTHER PUBLICATIONS

Frank Herzel et al, "An Integrated CMOS RF Synthesizer for 802.11a Wireless LAN," IEEE JSSC, vol. 38, No. 10, Oct. 2003.

(Continued)

*Primary Examiner* — Arnold Kinkead
*Assistant Examiner* — Richard Tan
(74) *Attorney, Agent, or Firm* — Winston Hsu; Scott Margo

(57) ABSTRACT

The present invention discloses a frequency synthesizer which includes: a PLL including an oscillator for generating an oscillator signal and a first frequency divider for dividing a frequency of the oscillator signal to generate a first frequency-divided signal; a switching unit for switching the PLL to either an open loop status or a closed loop status; a second frequency divider, for dividing a frequency of a reference clock to generate a second frequency-divided signal; a counter, for counting according to the first frequency-divided signal and the second frequency-divided signal to generate a counter value when the PLL is in the open loop status; a comparator, for comparing the counter value with a predetermined value to generate a comparing result; and a determining unit, for adjusting an oscillator frequency of the oscillator according to the comparing result.

8 Claims, 8 Drawing Sheets

U.S. PATENT DOCUMENTS

| | | |
|---|---|---|
| 2003/0042985 A1 | 3/2003 | Shibahara |
| 2003/0171106 A1 | 9/2003 | Dunworth |
| 2005/0068111 A1 | 3/2005 | Kasahara |
| 2005/0083137 A1 | 4/2005 | Lee |
| 2006/0114069 A1 | 6/2006 | Kojima |
| 2006/0139105 A1 | 6/2006 | Maxim |
| 2006/0158264 A1 | 7/2006 | Kousai |
| 2006/0211393 A1 | 9/2006 | Chien |
| 2006/0226916 A1 | 10/2006 | Florescu |
| 2007/0030079 A1 | 2/2007 | Kawamoto |

OTHER PUBLICATIONS

Tsung-Hsien Lin et al, "A 900-MHz 2.5mA CMOS Frequency Synthesizer with an Automatic SC Tuning Loop," IEEE JSSC, vol. 36, No. 3, Mar. 2001.

Yido Koo et al, "A Fully Integrated CMOS Frequency Synthesizer with Charge-Averaging Charge Pump and Dual-Path Loop Filter for PCS- and Cellular-CDMA Wireless Systems," IEEE JSSC, vol. 37, No. 5, May 2002.

William B. Wilson et al, "A CMOS Self-Calibrating Frequency Synthesizer," IEEE JSSC, vol. 35, No. 10, Oct. 2000, p. 1437-1444.

FREQUENCY SYNTHESIZER

CROSS REFERENCE TO RELATED APPLICATIONS

This is a continuation-in-part of co-pending U.S. patent application Ser. No. 11/781,961 filed on Jul. 24, 2007, which claims the benefit of U.S. provisional application No. 60/821,821, filed on Aug. 8, 2006. The whole contents of the related applications are incorporated herein by reference.

BACKGROUND OF THE INVENTION

1. Field of the Invention

The present invention relates to a phase-locked loop (PLL) technology, and more particularly, to a method for adjusting an oscillator in a PLL, and related frequency synthesizers.

2. Description of the Prior Art

For many kinds of communication devices (such as mobile phones), Multi-Mode/Multi-Band applications are increasingly utilized, and a mobile communication device often uses a frequency synthesizer with a wide frequency adjusting range for providing required clock signals in this type of application.

In general, the frequency synthesizer is realized by using a phase-locked loop (PLL) scheme. The gain value of an oscillator in the PLL of the frequency synthesizer should be maintained at a low level so as to meet a strict requirement for the phase noise in the mobile communication standard. In order to attain the above purpose, most oscillators of the frequency synthesizer are realized by using a switched capacitor voltage-controlled oscillator (switched capacitor VCO) so as to increase the frequency adjusting range of the frequency synthesizer.

It is known that the locking speed of the PLL has a large influence on the whole efficiency of the frequency synthesizer. Thus, how to improve the locking speed of the PLL that uses a switched capacitor oscillator scheme is a problem requiring a solution.

SUMMARY OF THE INVENTION

It is therefore one of the objectives of the present invention to provide a method for adjusting an oscillator in a phase-locked loop (PLL) and related frequency synthesizers so as to solve the above problem.

According to one embodiment of the present invention, a frequency synthesizer is disclosed. The frequency synthesizer includes: a PLL including an oscillator for generating an oscillator signal and a first frequency divider, for dividing a frequency of the oscillator signal to generate a first frequency-divided signal; a switching unit, for switching the PLL to either an open loop status or a closed loop status, wherein a control signal of the oscillator is substantially constant when the PLL is in the open loop status; a second frequency divider, for dividing a frequency of a reference clock to generate a second frequency-divided signal; a counter, for counting according to the first frequency-divided signal and the second frequency-divided signal to generate a counter value when the PLL is in the open loop status; a comparator, for comparing the counter value with a predetermined value to generate a comparing result; and a determining unit, for adjusting an oscillator frequency of the oscillator according to the comparing result.

In a preferred embodiment, the predetermined value is 2N in binary form, and N is a positive integer. The comparator comprises a first logic circuit for comparing at least one most significant bit (MSB) of the predetermined value and at least one MSB of the counter value, and a second logic circuit for comparing the rest bits of the predetermined value and the rest bits of the counter value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
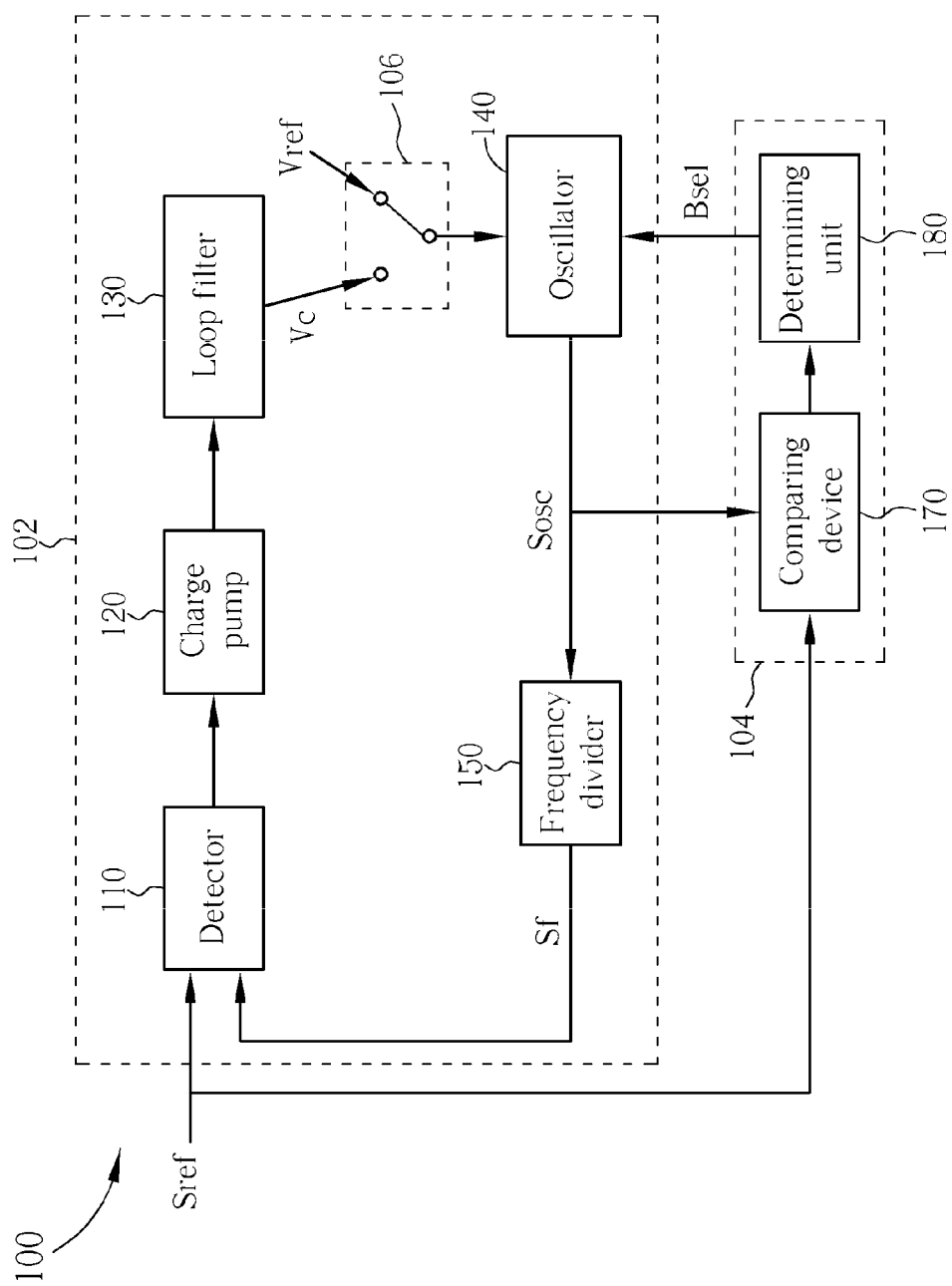
FIG. 1 shows a simplified block diagram of a frequency synthesizer according to a first embodiment of the present invention.

Please refer to FIG. 1. FIG. 1 shows a simplified block diagram of a frequency synthesizer 100 according to a first embodiment of the present invention. As shown in FIG. 1, the frequency synthesizer 100 includes a phase-locked loop (PLL) 102, a setting unit 104, and a switching device 106. The PLL 102 of the first embodiment includes: a detector 110 for detecting a frequency difference and/or a phase difference between a reference clock Sref and a frequency-divided signal Sf; a charge pump 120 for generating a control current according to a detecting result of the detector 110; a loop filter 130 for generating a control signal Vc according to the control current; an oscillator 140 for generating an oscillator signal Sosc according to the control signal Vc; and a frequency divider 150 for dividing frequency of the oscillator signal Sosc to generate the frequency-divided signal Sf. In practice, the detector 110 can be realized by utilizing a phase frequency detector (PFD), the loop filter 130 can be various kinds of active filters or passive filters, and the oscillator 140 can be realized by utilizing a switched capacitor voltage controlled oscillator (switched capacitor VCO).

In the frequency synthesizer 100, the setting device 104 is utilized for adjusting an oscillator frequency of the oscillator 140, and the switching device 106 is utilized for switching the PLL 102 to either an open loop status or a closed loop status. The adjusting process of the oscillator 140 in the frequency synthesizer 100 can be divided into two modes, and the two modes are respectively a coarse tuning mode and a fine tuning mode. The switching device 106 will switch the PLL 102 to the open loop status in the coarse tuning mode, and the switching device 106 will switch the PLL 102 to the closed loop status in the fine tuning mode. The adjustment scheme of the oscillator 140 will be further described in the following paragraphs with reference to FIG. 2.

Figure 2:
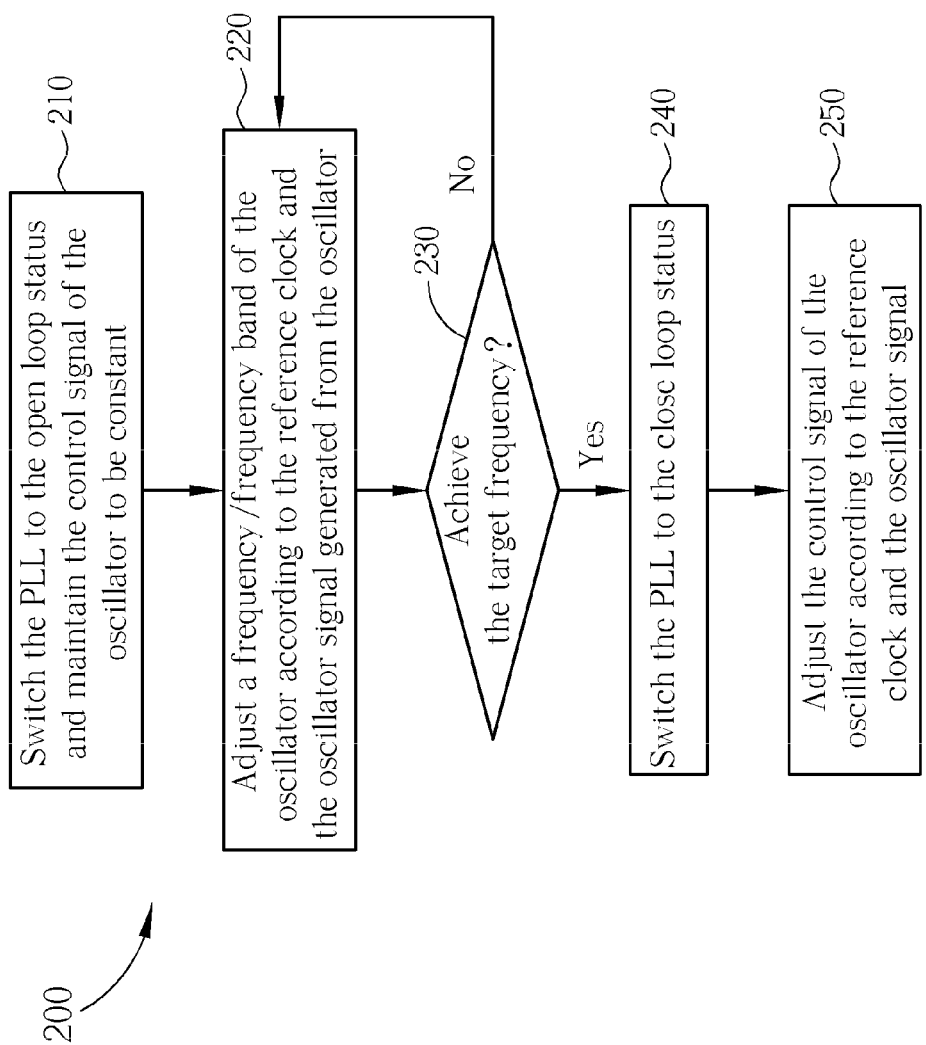
FIG. 2 is a flow chart showing an exemplary method for adjusting the oscillator of a PLL according to an embodiment of the present invention.

FIG. 2 is a flowchart 200 showing an exemplary method for adjusting the oscillator 140 of the PLL 102 according to an embodiment of the present invention. The steps included in the flowchart 200 will be described in the following paragraphs.

In the step 210, the switching device 106 will switch the PLL 102 to the open loop status, and maintain a control signal of an input node of the oscillator 140 at a constant level, so as to enter the coarse tuning mode. As shown in FIG. 1, the switching device 106 is coupled between the loop filter 130 and the oscillator 140 of the PLL 102. When the switching device 106 has switched the control signal of the oscillator 140 to a reference voltage Vref that is substantially constant, the PLL 102 will be in the open loop status. Please note that the above description is only an embodiment, and not a limitation of the practical implementation of the switching device 106 in the present invention.

Figure 3:
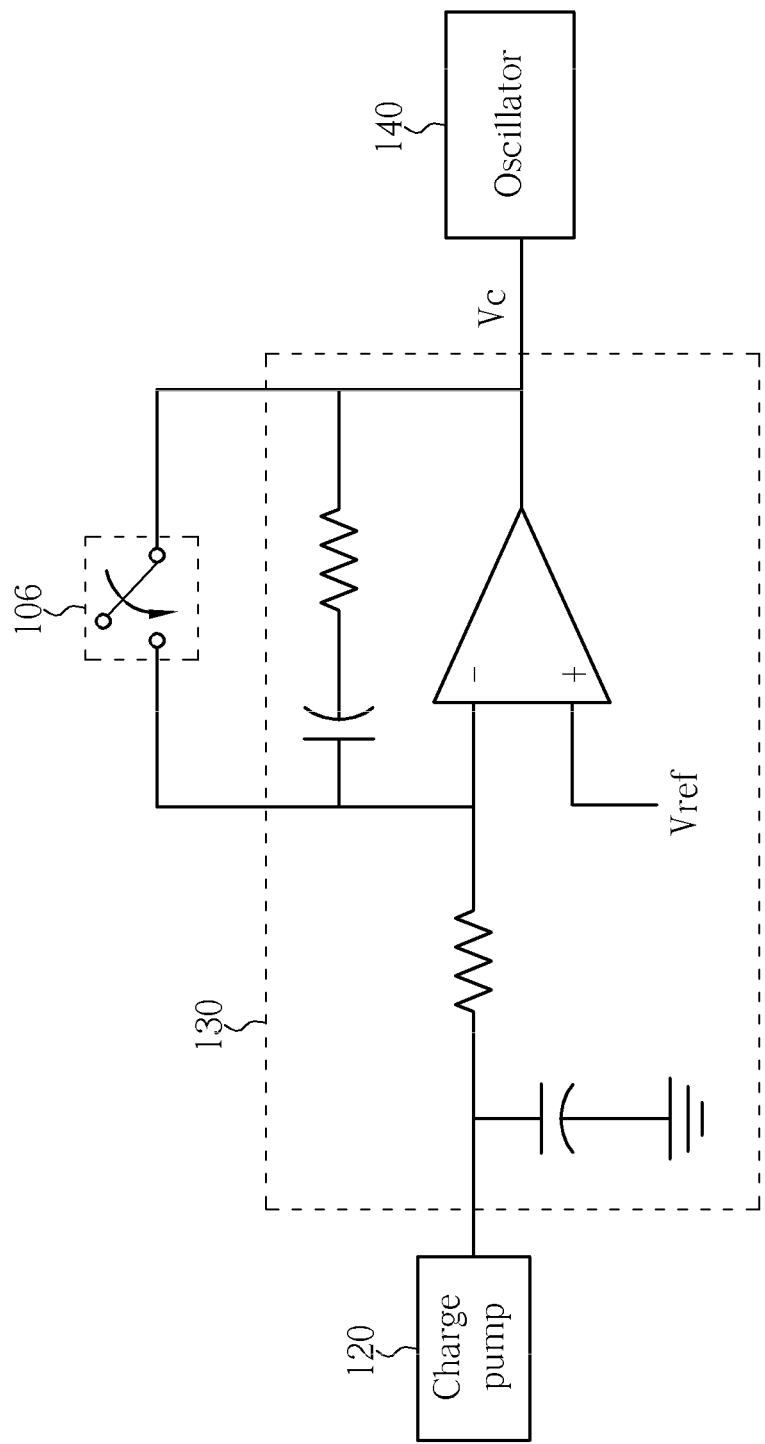
FIG. 3 shows a simplified block diagram of the practical implementation of a switching device according to another embodiment of the present invention.

For example, FIG. 3 shows a simplified block diagram of the practical implementation of the switching device 106 according to another embodiment of the present invention. As shown in FIG. 3, the loop filter 130 is a filter having an operational amplifier-resistor-capacitor (OP-RC) architecture (i.e. OP-RC filter), and the switching device 106 is coupled between an input node and an output node of the operational amplifier of the loop filter 130. When the switching device 106 is turned on and the charge pump 120 is disabled, the control signal Vc outputted by the loop filter 130 will be equal to the reference voltage Vref that is substantially constant, and this condition is equivalent to that of the PLL 102 being in the open loop status.

When the PLL 102 is in the open loop status, the setting unit 104 will adjust a frequency and/or frequency band of the oscillator 140 according to the reference clock Sref and the oscillator signal Sosc generated from the oscillator 140 according to the reference voltage Vref when the PLL is in the open loop status (the step 220).

As shown in FIG. 1, the setting unit 104 of the first embodiment includes a comparing device 170 and a determining unit 180. The comparing device 170 is utilized for comparing the oscillator signal Sosc with the reference clock Sref, and the determining unit 180 is utilized for adjusting the frequency of the oscillator 140 according to a comparing result of the comparing device 170. For example, the comparing device 170 is able to compare the frequency of the oscillator signal Sosc with the frequency of the reference clock Sref so as to generate a comparing result, and the determining unit 180 is able to adjust the frequency of the oscillator 140 according to the comparing result in order to achieve the purpose of coarsely tuning the oscillator 140.

Figure 4:
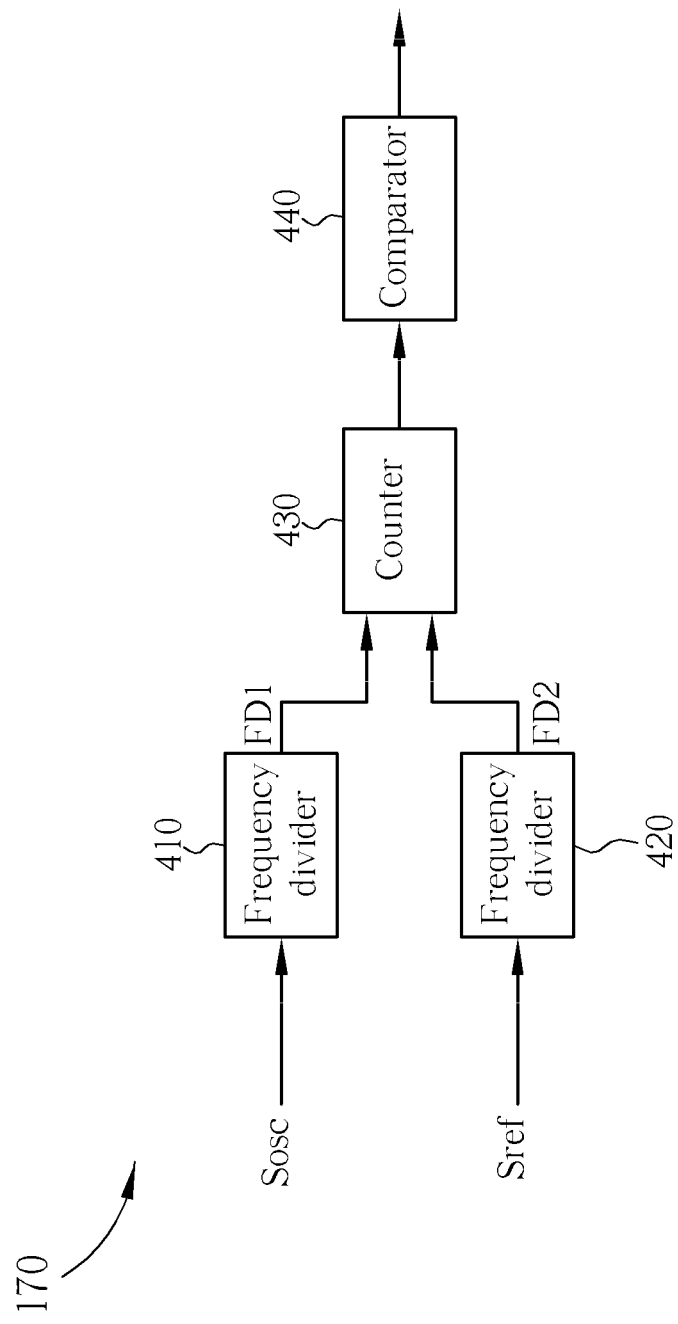
FIG. 4 shows a simplified block diagram of a first embodiment of the comparing device of the present invention.

FIG. 4 shows a simplified block diagram of a first embodiment of the comparing device 170 of the present invention. The comparing device 170 of this first embodiment includes two frequency dividers 410 and 420, a counter 430, and a comparator 440. The frequency divider 410 is utilized for dividing frequency of the oscillator signal Sosc to generate a first frequency-divided signal FD1, and the frequency divider 420 is utilized for dividing frequency of the reference clock Sref to generate a second frequency-divided signal FD2. The counter 430 is utilized for counting according to the first frequency-divided signal FD1 and the second frequency-divided signal FD2 to generate a counter value, and the comparator 440 is utilized for comparing the counter value with a predetermined value to generate a comparing result.

Under a normal condition, a target frequency of the oscillator signal Sosc should be a frequency of the reference clock Sref multiplied by a divisor value of the frequency divider 150 in the PLL 102. For example, assuming that the frequency of the reference clock Sref is 100 MHz, and the divisor value of the frequency divider 150 is 4, then the target frequency of the oscillator signal Sosc should be 400 MHz. If the divisor value of the frequency divider 410 in the comparing device 170 is 5, and the divisor value of the frequency divider 420 is 10, then the frequency of the second frequency-divided signal FD2 is 10 MHz, and the frequency of the first frequency-divided signal FD1 should be 80 MHz. Thus, the counter 430 is able to count a number of rising edges (or falling edges) of the first frequency-divided signal FD1 during a period of the second frequency-divided signal FD2, and the comparator 440 is able to compare the counter value obtained by the counter 430 with a predetermined value 8 (=80/10) so as to determine whether the oscillator frequency of the oscillator 140 is the required value.

If the counter value is larger than the predetermined value 8, then it means that the oscillator frequency of the oscillator 140 is too high. If the counter value is smaller than the predetermined value 8, then it means that the oscillator frequency of the oscillator 140 is too low. If the counter value is equal to the predetermined value 8, then it means that the setting of the oscillator 140 at the time fits in with the required frequency range. In other words, the frequency band selected by the oscillator 140 at the time is a proper one. In practice, the divisor values of the frequency divider 410 and 420 are preferred to be integral values, and the predetermined value is preferred to be 2N (wherein N is a positive integer) so as to reduce the complexity of the follow-up circuit. For implementing a digital comparator, a variety of Boolean functions requires to be implemented, meaning that a variety of logic circuits required being disposed in the digital comparator, and the number of the logic circuits and the complexity thereof increase with the number of bits of the value to be compared with. However, once the predetermined value is limited to $2^N$, logic circuits required to be implemented in the digital comparator can be therefore simplified. In the manner of the digital comparator dedicated to comparing with $2^N$ value with other value, only an AND logic function and an OR logic function are possibly necessary in a preferred embodiment. As the predetermined value $2^N$ must be in binary form of 100, 1000, 10000, and so on, the AND logic function is possibly utilized for checking whether the values of most significant bit (MSB) of the predetermined value $2^N$ and the value to be compared with are the same. If not the same, it means that the value to be compared with is smaller than the predetermined value $2^N$ (whose MSB is always 1). If the same, it means that the value to be compared with is greater than or equal to the predetermined value $2^N$. To figure out this, an OR logic function can be utilized for checking rest bits (except MSB) of the value be compared with. This is because the rest bits of the predetermined value $2^N$ must be 0, and the value be compared with should be greater than the predetermined value $2^N$ if one of rest bits of the values is 1.

Figure 8:
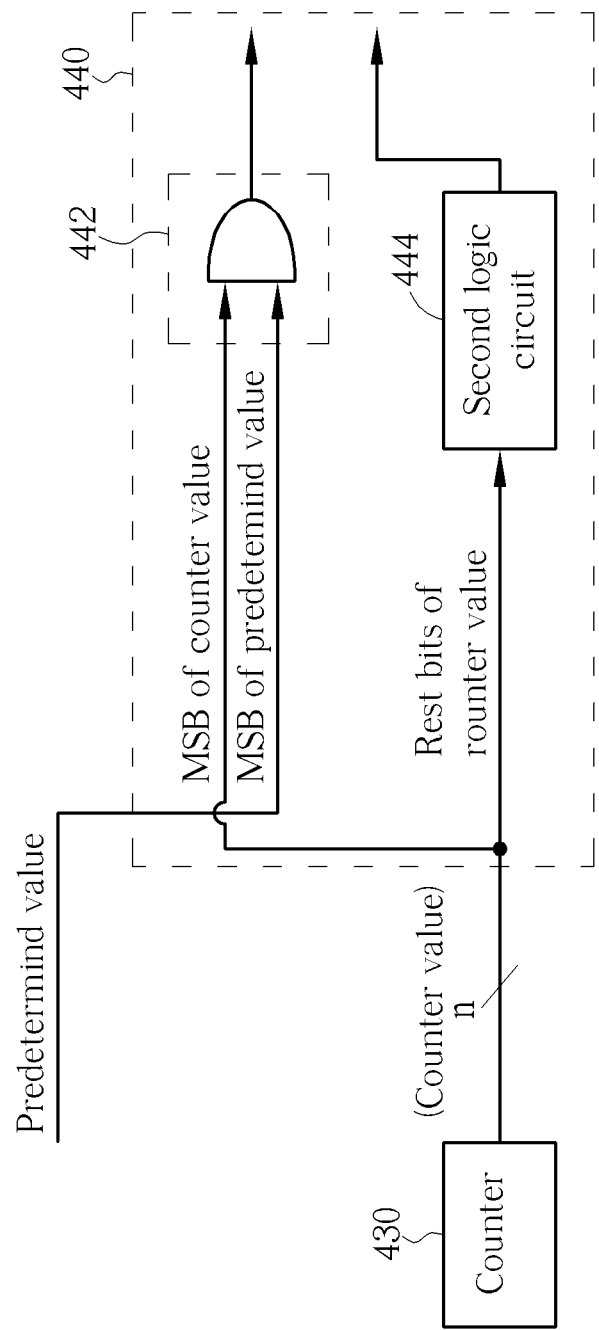
FIG. 8 shows a block diagram of the practical implementation of the comparator 440 according to one embodiment of the present invention.

FIG. 8 shows a block diagram of the practical implementation of the comparator 440 according to one embodiment of the present invention. As illustrated in FIG. 8, the comparator 440 comprises a first logic circuit 442 and a second logic circuit 444. Preferably, the first logic circuit 442 performs the AND logic function (based on AND logic gate) to check whether the value of at least one most significant bit (MSB) of the predetermined value and the value of at least one MSB of a counter value generated by the counter 430 are the same. Preferably, the second logic circuit 444 performs the OR logic function (based on OR logic gate) to check rest bits (except MSB) of the counter value generated by the counter 430. Assuming that the predetermined value is $2^N$, the counter value is greater than the predetermined value if one of rest bits of the counter values is 1 and the MSB of the predetermined value and the MSB of the counter value is the same. Therefore, when the first logic circuit 442 outputs the value of 1 and the second logic circuit 444 also outputs the value of 1, the counter value is determined as greater than the predetermined value. When the first logic circuit 442 outputs the value of 1 and the second logic circuit 444 outputs the value of 0, the counter value is determined as equal to the predetermined value. When the first logic circuit 442 outputs the value of 0, the counter value is determined as smaller than the predetermined value.

Figure 5:
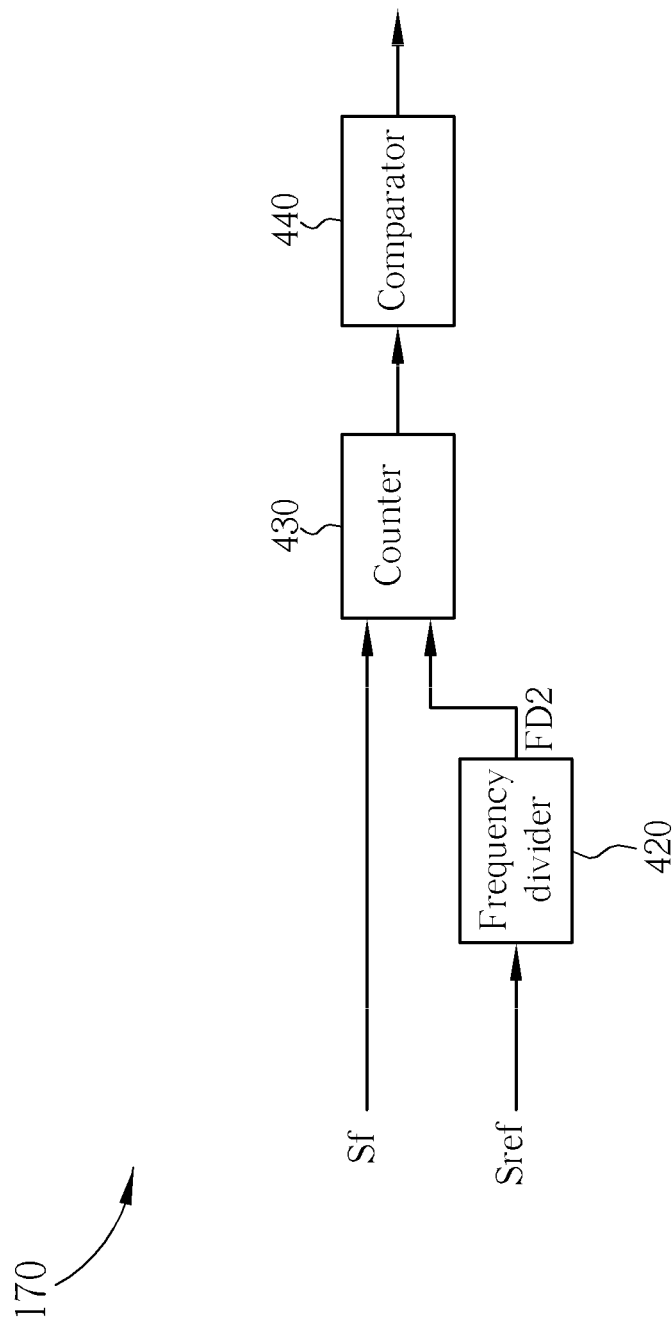
FIG. 5 shows a simplified block diagram of a second embodiment of the comparing device of the present invention.

It can be seen from the above illustration that the comparing device 170 of the setting unit 104 is able to determine whether the setting of the oscillator 140 is appropriate by comparing the oscillator signal Sosc with the reference clock Sref, but this is only an embodiment, and not a limitation of the practical realization in the present invention. For example, FIG. 5 shows a simplified block diagram of a second embodiment of the comparing device 170 of the present invention. In this second embodiment, the counter 430 is utilized for counting according to the second frequency-divided signal FD2 and a frequency-divided signal Sf outputted by the frequency divider 150 of the PLL 102 to generate a counter value, and the comparator 440 is utilized for comparing the counter value of the counter 430 with a predetermined value to generate a comparing result. Similarly, the counter 430 is able to count a number of rising edges (or falling edges) of the frequency-divided signal Sf during a period of the second frequency-divided signal FD2, and the comparator 440 is only required to compare the counter value obtained by the counter 430 with a division value of the frequency divider 420 so as to determine whether the setting of the oscillator 140 is appropriate. In other words, the comparing device 170 of the setting unit 104 is also able to determine whether the setting of the oscillator 140 is appropriate by comparing the frequency-divided signal Sf with the reference clock Sref. In practice, the divisor values of the frequency divider 150 and 420 are preferred to be integral values, and the predetermined value is preferred to be 2N (wherein N is a positive integer) so as to reduce the complexity of the follow-up circuit. In a preferred embodiment, the comparing device 170 and the PLL 102 is able to jointly use the same frequency divider 150 so as to reduce the square area of the whole circuit.

Next, the comparing device 170 will send the comparing result to the determining unit 180 so that the determining unit 180 is able to adjust the setting of the oscillator 140 according to the comparing result. For a specific description the oscillator 140 being realized by utilizing a switched capacitor oscillator is taken as an example. When the oscillator frequency of the switched capacitor oscillator is too high, the determining unit 180 will increase the total capacitance of the switched capacitor oscillator to lower the oscillator frequency of the switched capacitor oscillator, and when the oscillator frequency of the switched capacitor oscillator is too low, the determining unit 180 will decrease the total capacitance of the switched capacitor oscillator to increase the oscillator frequency of the switched capacitor oscillator. In practice, the determining unit 180 is able to use some algorithms such as a linear search algorithm, a binary search algorithm, or a successive approximation algorithm, during the process of adjusting a varactor setting value of the switched capacitor oscillator.

It can be seen from the above illustration that the setting unit 104 can be designed for adjusting the frequency of the oscillator 140 according to the reference clock Sref and the oscillator signal Sosc, or can be designed for adjusting the frequency of the oscillator 140 according to the reference clock Sref and the frequency-divided signal Sf.

In a preferred embodiment, when the oscillator 140 is realized by utilizing the switched capacitor oscillator, the setting unit 104 will further refer to the varactor tuning characteristics of the switched capacitor oscillator to select the frequency band of the switched capacitor oscillator in the step 220. For a further description, if the determining unit 180 of the setting unit 104 is not able to make the counter value of the counter 430 of the comparing device 170 equal to the predetermined value utilized by the comparator 440 by adjusting the varactor setting value of the of the switched capacitor oscillator, then the determining unit 180 of this preferred embodiment is able to determine a proper frequency band for the switched capacitor oscillator according to the varactor tuning characteristics of the switched capacitor oscillator.

Figure 6:
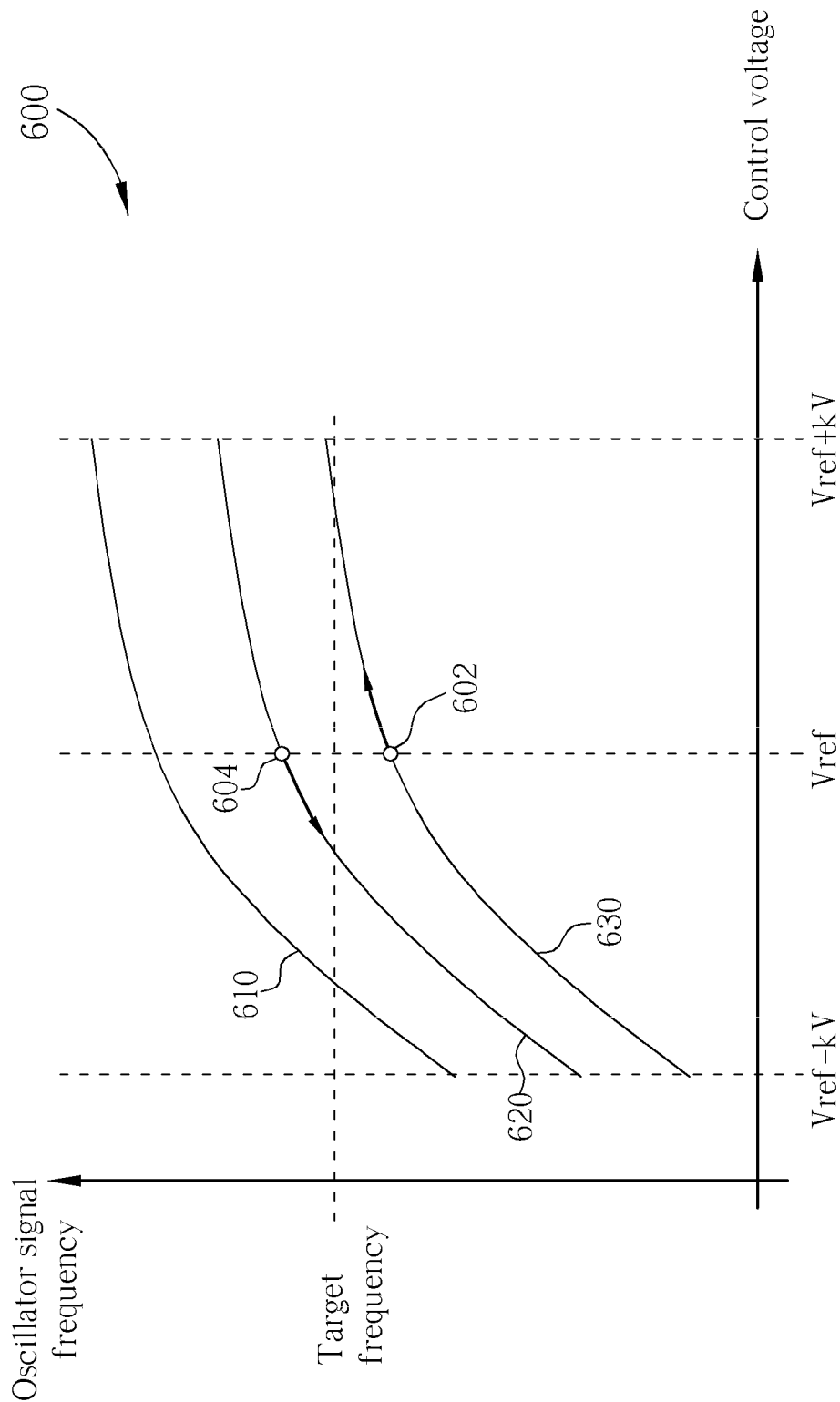
FIG. 6 shows a diagram of the varactor tuning characteristics of a switched capacitor oscillator according to an embodiment of the present invention.

Please refer to FIG. 6. FIG. 6 shows a diagram of the varactor tuning characteristics of the switched capacitor oscillator according to an embodiment of the present invention. As shown in FIGS. 6, 610, 620, and 630 represent three frequency bands that the switched capacitor oscillator is able to select, and the reference voltage Vref corresponds to the middle points of these frequency bands. Assuming that the frequency band currently selected by the switched capacitor oscillator is 630, then after the frequency synthesizer 100 enters the fine tuning mode, the switched capacitor oscillator has to be adjusted from the frequency point 602 at the current frequency band 630 along the upper right hand direction in order to achieve the position of the target frequency point. If the frequency band 620 is selected for the switched capacitor oscillator, then the switched capacitor oscillator has to be adjusted from the frequency point 604 at the frequency band 620 along the lower left hand direction in order to achieve the position of the target frequency point. As shown in FIG. 6, the varactor tuning characteristics curve in the right field of the frequency point 602 at the frequency band 630 has a more gradual slope, and the varactor tuning characteristics curve in the left field of the frequency point 604 at the frequency band 620 has a steeper slope. Thus, the determining unit 180 of the setting unit 104 will change the frequency band of the switched capacitor oscillator to the frequency band 620 so as to reduce the locking time after the frequency synthesizer 100 enters the fine tuning mode.

As shown in the flowchart 200 in FIG. 2, the setting unit 104 will perform the operation of the step 220 repeatedly before the oscillator 140 achieves the target frequency of the coarse tuning mode.

When the oscillator 140 achieves the target frequency of the coarse tuning mode (the step 230), the switching device 106 will switch the PLL 102 to the closed loop status (the step 240) in order to enter the fine tuning mode. In the first embodiment shown in FIG. 1, the switching device 106 will switch the input node of the oscillator 140 to the control signal Vc outputted by the loop filter 130, so as to make the PLL 102 be in the closed loop status. In the embodiment shown in FIG. 3, the switching device 106 will be turned off so as to make the PLL 102 be in the normal closed loop status.

When the PLL 102 is in the closed loop status, the PLL 102 will adjust the control signal Vc of the oscillator 140 according to the reference clock Sref and the oscillator signal Sosc (the step 250), so as to make the frequency of the oscillator signal Sosc achieve the required target frequency. Since the operational details related to the locking operation of the PLL 102 in the close loop status are well known to those of average skill in this art, further explanation is omitted herein for the sake of brevity.

The method for adjusting the oscillator mentioned above is also applicable to various schemes of the fractional-N frequency synthesizers.

Figure 7:
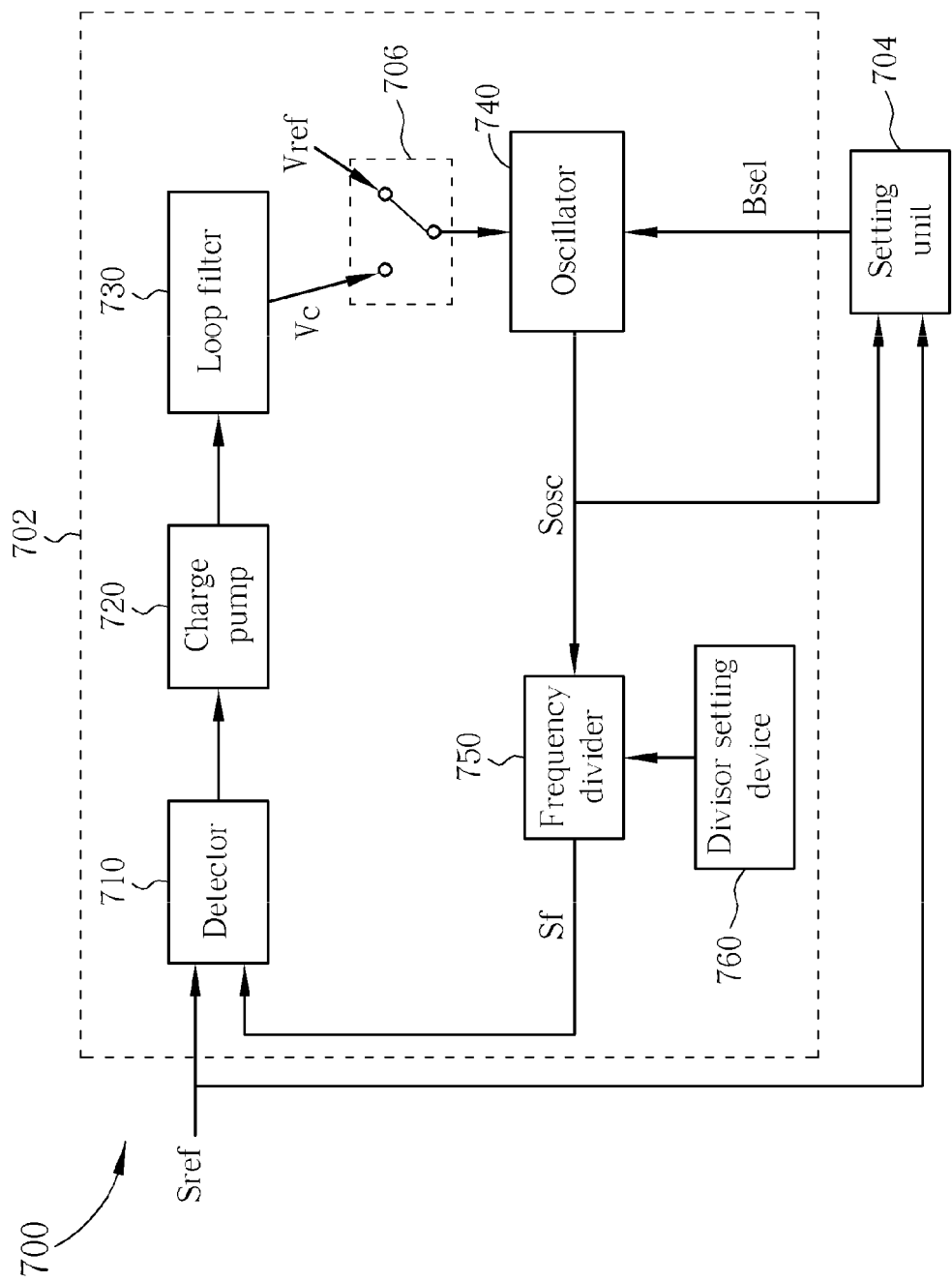
FIG. 7 shows a simplified block diagram of a frequency synthesizer according to a second embodiment of the present invention.

Please refer to FIG. 7. FIG. 7 shows a simplified block diagram of a frequency synthesizer 700 according to a second embodiment of the present invention. As shown in FIG. 7, the frequency synthesizer 700 includes a PLL 702, a setting unit 704, and a switching device 706. The PLL 702 of the second embodiment includes: a detector 710 utilizing for detecting a frequency difference and/or a phase difference between a reference clock Sref and a frequency-divided signal Sf; a charge pump 120 for generating a control current according to a detecting result of the detector 710; a loop filter 730 for generating a control signal Vc according to the control current; an oscillator 740 for generating an oscillator signal Sosc according to the control signal Vc; a frequency divider 750 for dividing frequency of the oscillator signal Sosc to generate the frequency-divided signal Sf; and a divisor setting device 760 for intermittently adjusting a divisor value of the frequency divider 750 so as to enable the frequency divider 750 perform a fractional-N frequency dividing operation.

As in the first embodiment mentioned above, the operation and implementation schemes of the setting unit 704 are also substantially the same as the setting unit 104. In other words, the setting unit 704 can be designed for adjusting the frequency of the oscillator 740 according to the reference clock Sref and the oscillator signal Sosc, or be designed for adjusting the frequency of the oscillator 740 according to the reference clock Sref and the frequency-divided signal Sf. However, please note that if the setting unit 704 adjusts the frequency/frequency band of the oscillator 740 according to the reference clock Sref and the frequency-divided signal Sf in the coarse tuning mode (i.e. if the PLL 702 is in the open loop status), then when the PLL 702 is in the open loop status, the divisor setting device 760 should set the divisor value of the frequency divider 750 to be a constant integral value. Since the operation and implementation schemes of the other elements of the PLL 702 are substantially the same as the first embodiment mentioned above, further explanation is omitted herein for the sake of brevity.

Similarly, the switching device 706 can be coupled between the loop filter 730 and the oscillator 740. If the loop filter 730 is a filter having an operational amplifier-resistor-capacitor (OP-RC) architecture (i.e. OP-RC filter), then the switching device 706 can also be coupled between an input node and an output node of the operational amplifier of the loop filter 730.

Since the frequency synthesizer mentioned above performs the coarse setting and adjustment for the oscillator (such as the switched capacitor oscillator) by the open loop scheme, and then performs the fine tuning for the control signal of the oscillator by the closed loop scheme, it is able to improve the calibrating speed of the oscillator effectively and further enhance the whole efficiency of the frequency synthesizer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency synthesizer, comprising:
    a PLL, comprising:
        an oscillator, for generating an oscillator signal; and
        a first frequency divider, for dividing a frequency of the oscillator signal to generate a first frequency-divided signal;
    a switching unit, for switching the PLL to either an open loop status or a closed loop status, wherein a control signal of the oscillator is substantially constant when the PLL is in the open loop status;
    a second frequency divider, for dividing a frequency of a reference clock to generate a second frequency-divided signal;
    a counter, for counting according to the first frequency-divided signal and the second frequency-divided signal to generate a counter value when the PLL is in the open loop status;
    a comparator, for comparing the counter value with a predetermined value to generate a comparing result; and
    a determining unit, for adjusting an oscillator frequency of the oscillator according to the comparing result;
    wherein the predetermined value is $2^N$ in binary form, and N is a positive integer;
    wherein the comparator comprises:
        a first logic circuit, for comparing at least one most significant bit (MSB) of the predetermined value and at least one MSB of the counter value; and
        a second logic circuit, for checking the rest bits of the counter value, wherein the first logic circuit and the second logic circuit are logic circuits of different types.

2. The frequency synthesizer of claim 1, wherein the PLL further comprises a loop filter, and the switching unit is coupled between the loop filter and the oscillator.

3. The frequency synthesizer of claim 1, wherein the PLL further comprises a loop filter having an operational amplifier-resistor-capacitor (OP-RC) architecture, and the switching unit is coupled between an input node and an output node of the operational amplifier.

4. The frequency synthesizer of claim 1, wherein the oscillator is a switched capacitor voltage-controlled oscillator (switched capacitor VCO).

5. The frequency synthesizer of claim 1, wherein the determining unit sets a frequency band of the switched capacitor VCO according to varactor tuning characteristics of the switched capacitor VCO.

6. The frequency synthesizer of claim 1, wherein the PLL determines the control signal of the oscillator according to a frequency difference or a phase difference between the reference clock and the first frequency-divided signal when the PLL is in the close loop status.

7. The frequency synthesizer of claim 1, wherein a divisor of the first frequency divider is an integral value when the PLL is in the open loop status.

8. The frequency synthesizer of claim 1, wherein the switching unit switches the PLL to the closed loop status after the determining unit has adjusted the oscillator frequency of the oscillator.

* * * * *